(12) United States Patent
Keinert et al.

(10) Patent No.: US 10,417,377 B2
(45) Date of Patent: Sep. 17, 2019

(54) LAYOUTING OF INTERCONNECT LINES IN INTEGRATED CIRCUITS

(71) Applicant: International Business Machines Corporation, Armonk, NY (US)

(72) Inventors: Joachim Keinert, Altdorf (DE); Jens Noack, Stuttgart (DE); Monika Strohmer, Sindelfingen (DE); Holger Wetter, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/000,341

(22) Filed: Jun. 5, 2018

(65) Prior Publication Data

US 2018/0285514 A1 Oct. 4, 2018

Related U.S. Application Data

(62) Division of application No. 14/941,508, filed on Nov. 13, 2015, now Pat. No. 10,013,521.

(51) Int. Cl.
*G06F 17/50* (2006.01)
*H01L 27/02* (2006.01)

(52) U.S. Cl.
CPC ...... *G06F 17/5081* (2013.01); *G06F 17/5077* (2013.01); *H01L 27/0207* (2013.01)

(58) Field of Classification Search
USPC ........................................ 716/113
See application file for complete search history.

(56) References Cited

U.S. PATENT DOCUMENTS

| 5,708,621 | A | | 1/1998 | Tanoi | |
|---|---|---|---|---|---|
| 5,841,688 | A | * | 11/1998 | Sukegawa | G11C 5/063 365/63 |
| 5,903,488 | A | | 5/1999 | Tanoi | |
| 5,940,315 | A | | 8/1999 | Cowles | |
| 6,236,117 | B1 | * | 5/2001 | Ishigaki | H01L 27/11 257/734 |
| 6,953,960 | B2 | * | 10/2005 | Tomishima | G11C 5/063 257/296 |
| 7,297,996 | B2 | * | 11/2007 | Sato | H01L 27/0207 257/208 |
| 7,570,504 | B2 | | 8/2009 | Vo | |
| 7,760,582 | B2 | | 7/2010 | Tomishima | |

(Continued)

OTHER PUBLICATIONS

Jung, Soon-Moon, et al.; Abstract: "High Speed and Highly Cost Effective 72M Bit Density S3 SRAM Technology With Doubly Stacked Si Layers, Peripheral Only Cosix Layers and Tungsten Shunt W/L Scheme for Standalone and Embedded Memory"; 2007 IEEE Symposium on VLSI Technology; pp. 82-83; Jun. 2007.

(Continued)

*Primary Examiner* — Mohammed Alam
(74) *Attorney, Agent, or Firm* — Alexander G. Jochym

(57) ABSTRACT

The invention relates to an integrated circuit comprising: a row of sink cells, a first driver cell, a second driver cell, an interconnect line connecting the first driver cell to the sink cells of the row; and a shunt line connecting the second driver cell to a point between ends of the interconnect line, wherein a segment of the interconnect line between the point and the first driver cell is bigger than 60% of a length the interconnect line and less than 80% of the length of the interconnect line.

12 Claims, 5 Drawing Sheets

(56) References Cited

U.S. PATENT DOCUMENTS

| | | | |
|---|---|---|---|
| 2002/0153545 A1* | 10/2002 | Tomishima | G11C 5/063 257/296 |
| 2004/0089913 A1 | 5/2004 | Yano et al. | |
| 2004/0135613 A1* | 7/2004 | Arkas | G06F 1/10 327/277 |
| 2007/0204253 A1* | 8/2007 | Murakawa | G06F 17/5077 716/139 |
| 2009/0267128 A1 | 10/2009 | Maejima | |
| 2010/0165775 A1 | 7/2010 | Obayashi et al. | |
| 2013/0193488 A1 | 8/2013 | Or-Bach et al. | |
| 2017/0140088 A1* | 5/2017 | Keinert | G06F 17/5081 |

OTHER PUBLICATIONS

List of IBM Patents or Patent Applications Treated as Related, Appendix P, Filed Herewith, 2 pages.
Keinert, et al., "Layouting of Interconnect Lines in Integrated Circuits", U.S. Appl. No. 14/941,508, filed Nov. 13, 2015.
Keinert, et al., "Layouting of Interconnect Lines in Integrated Circuits", U.S. Appl. No. 16/000,271, filed Jun. 5, 2018.

\* cited by examiner

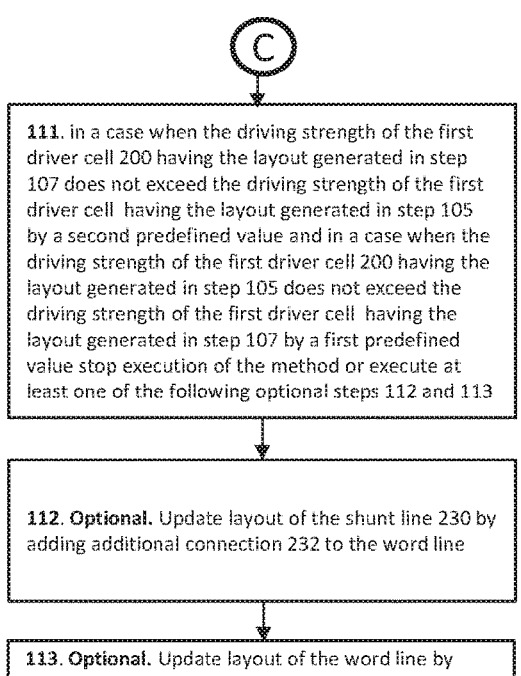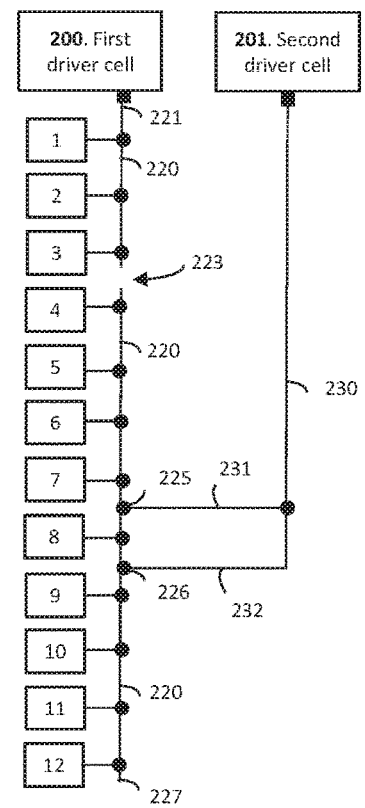
Fig. 1d
Fig. 2d ial circuits have billions of discrete elements (e.g. transistors). Terminals of the discrete elements are connected by multi-level wiring. The wiring is one of the critical elements of the integrated circuits determining an upper limit of clock frequencies of the integrated circuits. The wiring has to be designed in a way that it enables error free propagation of electrical signals synchronized with the clock frequency. This means that electrical signals have to be received at receiving terminals within a time window in a tact interval. The receipt of electrical signals has to be error free. As usual it requires not only timely receiving of the electrical signals at the receiving terminals but also satisfying a required slew rate of the electrical signals at the receiving terminals.

LAYOUTING OF INTERCONNECT LINES IN INTEGRATED CIRCUITS

BACKGROUND

Modern integrated circuits have billions of discrete elements (e.g. transistors). Terminals of the discrete elements are connected by multi-level wiring. The wiring is one of the critical elements of the integrated circuits determining an upper limit of clock frequencies of the integrated circuits. The wiring has to be designed in a way that it enables error free propagation of electrical signals synchronized with the clock frequency. This means that electrical signals have to be received at receiving terminals within a time window in a tact interval. The receipt of electrical signals has to be error free. As usual it requires not only timely receiving of the electrical signals at the receiving terminals but also satisfying a required slew rate of the electrical signals at the receiving terminals.

Modern digital circuitry has tolerances for error free propagation of electrical signals in the picosecond range. The problem of finding an appropriate wiring topology is complicated by the need to design interconnect lines and the driving cells generating signals in the interconnect lines complying with the design rules. In a case when an interconnect line connects many sink cells to a driver cells an approach based on straightforward increase in a driving strength of the driver cell and a current loading capacity of the interconnect line can be counterproductive. For instance, a required cross-section of the interconnect line can substantially exceed the cross-section of the metallization wires in the metallization layer comprising the interconnect line and/or the driver cell might need to have very big transistors of the output cascade in order to provide required rising and/or falling slew rate of a signal generated at input terminals of the sink cells. In order to avoid big topological disparity between other elements of the design and the driver cell and/or interconnect line and/or in order to generate layouts of the driver cell and/or interconnect line complying with the design rules the interconnected lines are shunted by the shunt lines. The shunt lines can be connected to the same driver cells as the respective interconnect lines, or they can be connected to additional/auxiliary driver cells. When the shunt lines are employed for facilitating of the propagation of the electrical signals in the respective interconnect lines, not only propagation of electrical signals in the wiring as such (e.g. interconnect lines) has to be taken into account but parasitic electromagnetic interactions of electrical signals propagating in adjacent wires (e.g. interconnect line and its shunt line) have to be taken into account as well. The last but not least problem is that a complete performance of the wiring can be calculated only when the wiring topology is completely generated. As a consequence a process of generation of the wiring topology is performed as usual just using simple design rules being primarily derived from constraints of an integrated circuit manufacturing process. Thus there is a need to improve the process of the generation of the wiring topology in a way that information related to the electrical performance of the wiring is taken into account during generation of the wiring topology resulting in a solution meeting the requirements of electrical performance of the wiring.

SUMMARY

A driving strength of a source cell (e.g. driver cell) is, as understood here, a function of a rising slew rate and/or a falling slew rate of a signal generated by the source cell at an input terminal of a test load (e.g. capacitive) test when the source cell is connected to a source of electrical signal. Optionally, the function can be equal to either the rising slew or the falling slew rate.

The present invention provides for a method for generating layouts of shunted interconnection lines connecting source cells (e.g. driver cells) and sink cells in an integrated circuit (IC) and an IC generated according to the method.

One embodiment provides for an IC, comprising: a row of sink cells, a first driver cell, a second driver cell, an interconnect line connecting the first driver cell to the sink cells of the row, and a shunt line connecting the second driver cell to a point between ends of the interconnect line, wherein a segment of the interconnect line between the point and the first driver cell is bigger than 60% of a length the interconnect line and less than 80% of the length of the interconnect line.

Another embodiment provides for a computer-implemented method for layouting an interconnect line of an integrated circuit, IC, comprising: receiving a specification of propagation of an electrical signal in the interconnect line, the interconnect line connecting sink cells of the IC with a first driver cell connected to a source of the electrical signal, the sink cells being layouted in the IC as a row of the sink cells; generating a layout of the interconnect line and a shunt line of the interconnect line, the shunt line connecting a second driver cell with the interconnect line at a first point on the interconnect line, the second driver cell being connected to the source of the electrical signal, wherein a length of a segment of the interconnect line between the first driver cell and the first point is equal to a first length being less than a length of the interconnect line; generating a layout of the first driver cell having a minimum required driving strength required for propagating the electrical signal in a first segment of the word line between the first driver cell and a second point on the interconnect line having a first propagation property at the second point complying with the specification in assumption that interconnect line is disconnected at the second point, wherein a length of the first segment is a second length being less than the first length; and generating a layout of the second driver cell having a minimum required driving strength required for propagating the electrical signal in a second segment of the interconnect line between an open end of the interconnect line and the second point having a second propagation property at the second point complying with the specification and a third propagation property at the open end complying with the specification in assumption that the interconnect line is disconnected at the second point.

BRIEF DESCRIPTION OF THE SEVERAL VIEWS OF THE DRAWINGS

In the following embodiments of the invention are explained in greater detail, by way of example only, making reference to the drawings in which:

FIGS. 1a-d depict a flow diagram of a process for generating of layouts of an interconnect line and a shunt line.

FIGS. 2a-d depict circuit diagrams corresponding to the layouts of the interconnect line and the shunt line generated throughout execution of the method.

DETAILED DESCRIPTION

Source cells (e.g. driver cells) and sink cells (e. g. memory cells) are connected by interconnect lines (e.g. word lines) in ICs. In order to avoid unacceptable distortion of an electrical signal propagating from the driver cell to the sink cells along the interconnect line connecting the source cell to the sink cells a shunt line can be used. The shunt line can be connected to the same driver cell as the interconnect line or to another driver cell connected to the same source of an electrical signal as the driver cell connected to the interconnect line. The shunt line is further connected to the interconnect line in one or more points. Optimum allocation of these points and minimization of their number enable reduction of parasitic load (e.g. capacitive load) of the interconnect line and/or shunt line because the interconnect line and the shunt line are allocated in different metallization levels of the IC, as usual the shunt line is allocated above the interconnect line in a metallization layer being above a metallization layer in which the interconnect line is allocated. In its own turn, minimization of the parasitic load enables reduction in a driving strength of the driving cells and reduction in an IC power consumption. Minimization of the driving strength of the source cell (e.g. driver cell) has its benefit as well because it enables reduction in its geometrical footprint based on utilization of transistors having reduced geometrical footprint, since the driving strength is determined among other factors by a transistor channel width.

Although topologies of the interconnect line and the shunt line are very simple, as usual they are two metallization lines, wherein the interconnect line is allocated below the shunt line, the choice of optimum allocation of one or more pins connecting the interconnect line and the shunt line is a difficult task, especially when it is performed in conjunction with selection of optimum driving strength of the driving cells. Such a multi-parameter optimization requires an effective algorithm of optimization enabling determination of the optical layout. Straight-forward evaluation of all possible combinations of parameters does not seem to be a feasible approach which can lead to the optimal solution without demanding awesome computer resources.

Figure 1A:
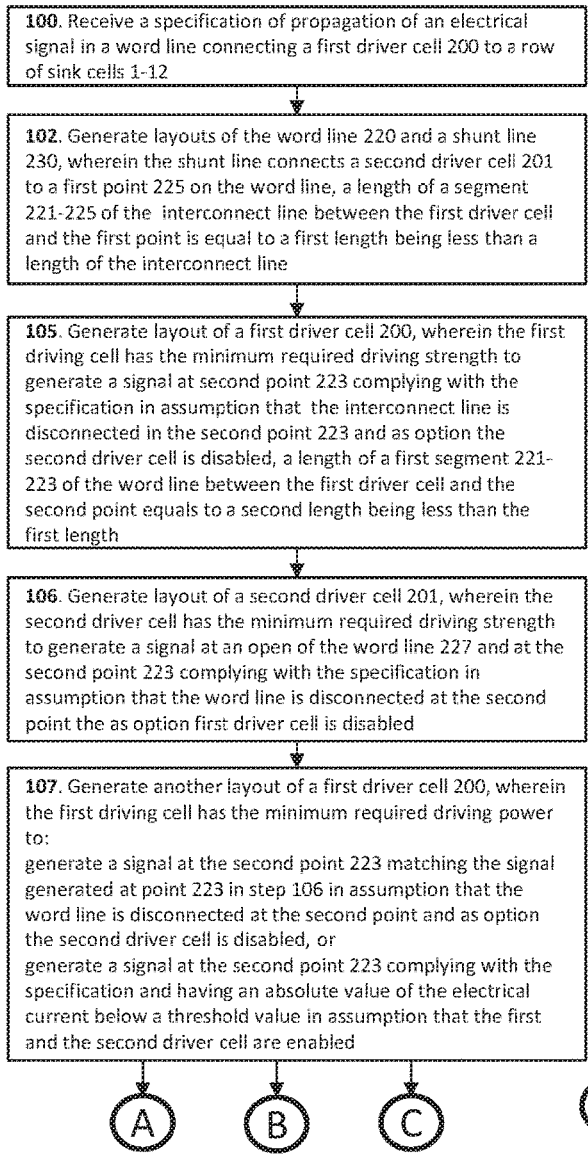
Figure 2A:
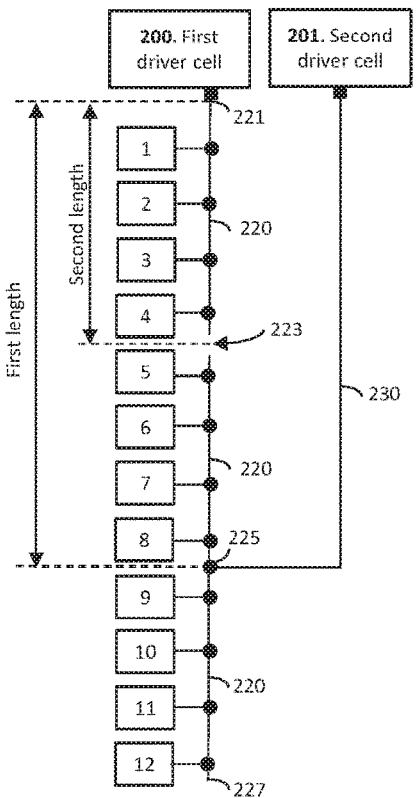
Figure 1B:
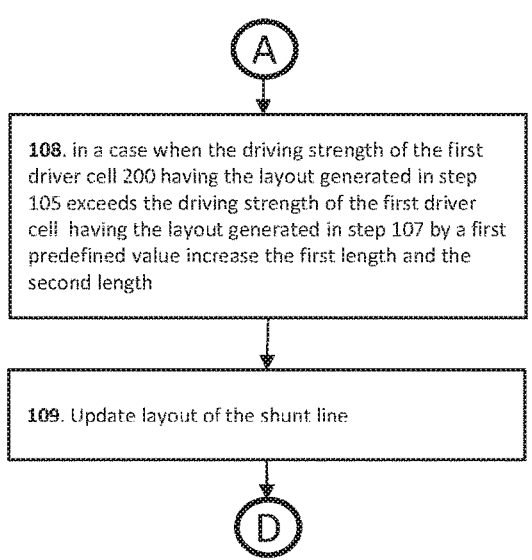

FIGS. 1a-1d depict a flow chart of a method for generating layouts of an interconnect line 220, a shunt line 230, a second driver cell 201 (i.e. a driver cell of the shunt line), and a first driver cell 200 (i.e. a driver cell of the interconnect line), which example electrical circuit diagram is depicted on FIG. 2a. The interconnect line connects the first driver 200 cell of the interconnect line with sink cells 1-12, which can be layouted as a row of the sink cells. The interconnect line can connect any arbitrary number of the sink cells to the first driver cell. The interconnect line can be a word line. The sink cells can be memory cells. Each of the sink cells can have more than one input terminal connected to the interconnect line. The first driver cell and the second driver cell can be connected to the same source of an electrical signal.

In a process block 100 as specification of propagation of an electrical signal in the interconnect line is received. The specification can comprise a time of propagation of an electrical signal in the interconnect line, and/or rising slew rates at input terminals of the sink cells, and/or falling slew rates at input terminals of the sink cells.

A process block 102 is executed after the process block 100, wherein a layout of the interconnect line 220 and layout of the shunt line 230 of the interconnect line are generated. The shunt line connects the second driver cell with the interconnect line at a first point on the interconnect line. A length of a segment 221-225 of the interconnect line between the first driver cell and the first point is equal to a first length being less than a length of the interconnect line 220. Preferably the first length is bigger than 60% of the length of the interconnect line and less than 80% of the length of the interconnect line. More preferably the first length is bigger than 63% of the length of the interconnect line and less than 69% of the length of the interconnect line.

Process blocks 105 and 106 are executed after the process block 102 in any sequence or in parallel to each other. In the process block 105 a layout of the first driver cell is generated. The first driver cell has a minimum required driving strength required for propagating the electrical signal in a first segment 221-223 of the word line between the first driver cell 200 and a second point 223 on the interconnect line. The electrical signal propagated in the first segment has a first propagation property at the second point 223 complying with the specification of the propagation of the electrical signal in the interconnect line, which was received in the process block 100. The minimum required strength of the first driver cell can be determined in assumption that interconnect line 220 is disconnected at the second point 223 and as option the second driver 201 is disabled. A length of the first segment is a second length being less than the first length. Preferably the second length is bigger than 25% of the length of the interconnect line and less than 35% of the length of the interconnect line. More preferably the first length is bigger than 31% of the length of the interconnect line and less than 36% of the length of the interconnect line.

In the process block 106 a layout of the second driver cell is generated. The second driver cell has a minimum required driving strength required for propagating the electrical signal in a second segment 227 of the interconnect line between an open end 227 of the interconnect line and the second point 223. The electrical signal propagated in the second segment has a second propagation property at the second point complying with the specification of the propagation of the electrical signal in the interconnect line, which was received in the process block 100. The electrical signal propagated in the second segment has a third propagation property at the open end complying with the specification of the propagation of the electrical signal in the interconnect line, which was received in the process block 100. The minimum required strength of the second driver cell can be determined in assumption that interconnect line 220 is disconnected at the second point 223 and as option the first driver 201 is disabled.

An output cascade of the first (second) driver cell can be a pair of an n-type field effect transistor (n-FET) and a p-type field effect transistor (p-FET) connected in series. In this case, a rising slew rate of an electrical signal generated by the first (second) driver cell in the interconnect line is determined by properties of the p-FET and the falling slew rate of an electrical signal generated by the first (second) driver cell in the interconnect line is determined by the properties of the n-FET. In the light of the definition formulated above the driving strength of the first driver can be a measure of either a falling slew rate or rising slew rate of an electrical signal generated by the first (second) driver cell in the interconnect line. When there is a need to compare in absolute terms driving strength of different driver cells, than a driving slew rate and/or falling slew rate has to be evaluated when the different driver cells receive via their input terminals the same electrical signals and connected to the same test loads in the same way. A sink cell having its input terminal connected to the driver cell can function as test load.

In the light of the definition of the driving strength formulated above the driving strength of the first driver cell and the second driver cell can be formulated as follows. The driving strength of the first driver cell is a function of a rising slew rate and/or a falling slew rate of a signal generated by the first driver cell at an input terminal of the sink cell, when only an input terminal of the first driver cell is connected to the source of the electrical signal and only said input terminal of the sink cell is connected to an output terminal of the first driver cell. The driving strength of the second driver cell is the function of a rising slew rate and/or a falling slew rate of a signal generated by the second driver cell at said input terminal of the sink cell, when only an input terminal of the second driver cell is connected to the source of the electrical signal and only said input terminal of the sink cell is connected to an output terminal of the second driver cell. The connection of said input terminal of the first driver cell to the source of the electrical signal is the same as the connection of said input terminal of the second driver to the source of the electrical signal. The connection of said output terminal of the first driver cell to said input terminal of the sink cell is the same as the connection of said output terminal of the second driver cell to said input terminal of the sink cell.

Figure 2B:
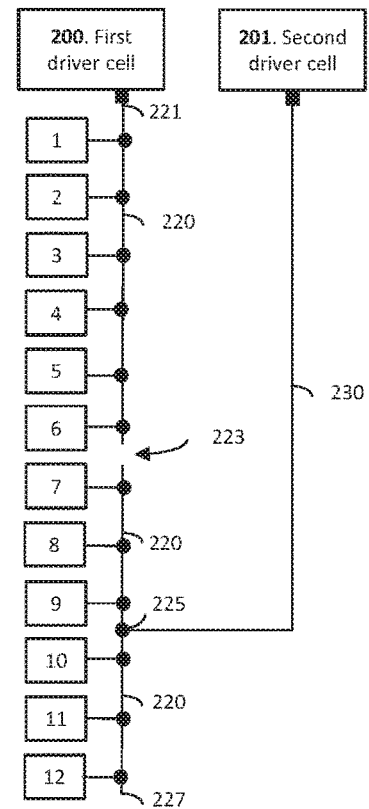
Figure 1C:
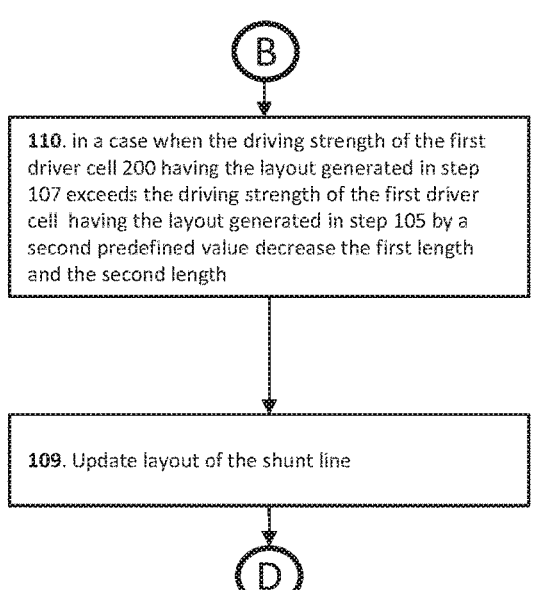

FIG. 2b depicts an example circuit diagram of a layout which can be generated after execution of the process blocks 100, 102, 105, and 106. In this case the interconnect line connects sink cells 1-12 to the first driver cell 200. The shunt line 230 connects the second driver cell 201 to the interconnect line 220 in the first point 225. The first length of the segment of the interconnect line between an output terminal of the first driver cell 200 and the first point 225 is equal to two thirds of a length of the interconnect line. The first point is allocated on the interconnect line between connections of the sink cells 8 and 9. The second point 223 is allocated at the interconnect line in the middle between the first point and the output terminal of the first drive cell, i.e. between connections of the sink cells 4 and 5. The second length of the first segment of the interconnect line between the second point and the output terminal of the first driver cell is equal to one third of the length of the interconnect line. The length of the second segment of the interconnect line between the open end of the interconnect line 227 and the second point is equal to two thirds of the length of the interconnect line.

A process block 107 is executed after the process blocks 105 and 106. In the process block 107 a further layout of the first driver cell is generated. The further layout has a minimum required driving strength required for propagating the electrical signal in the first segment having another first propagation property at the second point matching the second propagation property obtained in the previously executed process block 106. The further layout can be generated in assumption that the interconnect line 220 is disconnected at the second point 223 and as option the second driver cell is disabled.

The first and/or the second and/or the third propagation property comprise at least one of the following: rising slew rate, falling slew rate, and propagation time.

The another first propagation property matches the second propagation property when at least one of the following criteria is fulfilled: a propagation time of the another first propagation property differs from a propagation time of the second propagation property less than a first predefined value, a rising slew rate of the another first propagation property differs from a rising slew rate of the second propagation property less than a second predefined value, and a falling slew rate of the another first propagation property differs from a falling slew rate of the second propagation property less than a third predefined value.

Alternatively, the further layout generated in the process block 107 can be generated in assumption that the first and the second driver cells are enabled and the interconnect line is connected at the second point. In this case the further layout of the first driver cell can have a minimum required driving strength required for propagating the electrical signal in the interconnect line having another first propagation property at the second point complying with the specification of the propagation of the electrical signal in the interconnect line, which was received in the process block 100, and for providing an absolute value of an electrical current flowing through the second point being below a predefined value.

In a case when the driving strength of the first driver cell having the previously generated layout (i.e. in process block 105, which was executed last among other executed process blocks 105, if any) exceeds the driving strength of the first driver cell having the newly generated layout (i.e. in process block 107, which was executed last among other executed process blocks 107, if any) by a fourth predefined value a process block 108 is executed, wherein the first length is increased by a first increment value and the second length is increased by a second increment value. The first increment value is less than the second increment value. Preferably the first increment value is bigger than zero and less than 10% of the first length and the second increment value is bigger than zero and less than 10% of the second length. More preferably the first increment value is bigger than 3% and less than 7% of the first length and the second increment value is bigger than 3% and less than 7% of the second length. The first increment value and the second increment value have to be selected in a way that the increased first length is bigger than the increased second length and less than the length of the interconnect line.

In a case when the driving strength of the first driver having the newly generated layout (i.e. in process block 107, which was executed last among other executed process blocks 107, if any) exceeds the driving strength of the first driver cell having the previously generated layout (i.e. in process block 105, which was executed last among other executed process blocks 105, if any) by a fifth predefined value a process block 110 is executed, wherein the first length is decreased by a first decrement value and the second length is decreased by a second decrement value. The first decrement value is less than the second decrement value. Preferably the first decrement value is bigger than zero and less than 10% of the first length and the second decrement value is bigger than zero and less than 10% of the second length. More preferably the first decrement value is bigger than 3% and less than 7% of the first length and the second decrement value is bigger than 3% and less than 7% of the second length. The first decrement value and the second decrement value have to be selected in a way that the decreased second length is bigger than zero and less than the first length.

After updating the first length and the second length in one of the process blocks 108 and 110 a process block 109 is executed. In this process block the layout of the shunt line is updated in a way that the updated layout is based on the updated first length. The process blocks 105 and 106 are executed after the process block 109 in any sequence or simultaneously.

FIG. 2b depicts an updated circuit diagram, which previous state is depicted on FIG. 2a. The updated circuit diagram corresponds to the updated layout after execution of the process steps 108 and 109. In contrast to the circuit diagram depicted on FIG. 1a the circuit diagram depicted on FIG. 2b corresponds to the updated layout wherein the first length and the second length are increased. The first point on the interconnect line is allocated between connections of the sink cells 9 and 10, while the second point on the interconnect line is allocated between connections of the sink cells 6 and 7.

Figure 2C:
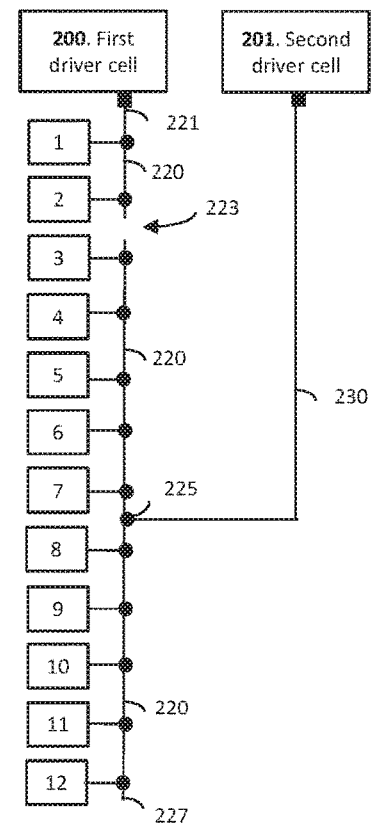

FIG. 2c depicts an updated circuit diagram, which previous state is depicted on FIG. 2a. The updated circuit diagram corresponds to the updated layout after execution of the process steps 110 and 109. In contrast to the circuit diagram depicted on FIG. 1a the circuit diagram depicted on FIG. 2c corresponds to the updated layout wherein the first length and the second length are decreased. The first point on the interconnect line is allocated between connections of the sink cells 2 and 3, while the second point on the interconnect line is allocated between connections of the sink cells 8 and 7.

In a case when the driving strength of the first driver cell having the previously generated layout (i.e. in process block 105, which was executed last among other executed process blocks 105, if any) does not exceed the driving strength of the first driver cell having the newly generated layout (i.e. in process block 107, which was executed last among other executed process blocks 107, if any) by the fourth predefined value and the driving strength of the first driver having the newly generated layout (i.e. in process block 107, which was executed last among other executed process blocks 107, if any) does not exceed the driving strength of the first driver cell having the previously generated layout (i.e. in process block 105, which was executed last among other executed process blocks 105, if any) by the fifth predefined value a process block 111 is executed. In the process block 111 the process of iterative layout optimization via the loop A-D and/or the loop B-D (FIGS. 1a-c) is stopped. The resulting layout can be saved and/or used as building block for further IC layouting. Alternatively, before the saving and or the using of the layout at least one of the following optional process blocks 112 and 113 can be executed. The process blocks 112 and 113 can be executed in different sequence or in parallel.

In the process block 113, the layout of the interconnect line is updated in a way that the interconnect line is disconnected in the second point 223, wherein the position of the second point on the interconnect line is its actual position.

In the process block 112, the layout of the shunt line is updated in in a way, that it is connected to the interconnect line at a third point. A length of a third segment of the interconnect line between the first driver cell (e.g. output terminal of the first driver cell) and the third point is bigger than 60% of the length of the interconnect line and less than 80% of the length of the interconnect line. Preferably the length of the third segment is bigger than 63% of the interconnect line and less than 69% of the length of the interconnect line. Having two connections (e.g. pins) between the shunt line and the interconnect line can be advantageous because of increased reliability/yield of the process employed for manufacturing of the IC comprising the layout generated according to the aforementioned method. When due to manufacturing failure one of the pins does not provide an electrical connection between the shunt line and the interconnect line, another pin can provide the electrical connection between the shunt line and the interconnect line and as a result thereof keep the circuitry functional.

FIG. 2d depicts an updated circuit diagram, which previous state is depicted on FIG. 2c. The updated circuit diagram corresponds to the updated layout after execution of the process steps 111 and 113. In contrast to the circuit diagram depicted on FIG. 2c the circuit diagram depicted on FIG. 2d corresponds to the updated layout wherein the shunt line is connected to the interconnect line in two points. The connection 231 of the shunt line to the interconnect line in the first point between the sink cells 7 and 8 was previously generated when the process block 110 was executed. The additional connection 232 of the shunt line to the interconnect line in a third point between the sink cells 8 and 9 is generated in the process block 112.

Various combinations of optional features specified in the process blocks 105-107 can be selected for implementing different embodiments of the method. In one embodiment the process blocks 105-107 are executed in assumption that the interconnect line is disconnected at the second point. In another embodiment, the process blocks 105 and 106 are executed in assumption that the interconnect line is disconnected at the second point and the process block 107 is executed in assumption that the interconnect line is connected at the second point and the first and the second driver cells are enabled.

The IC which layout is generated according to the aforementioned method can comprise the following elements: a row of sink cells, a first driver cell (or a first source cell), a second driver cell (a second source cell), an interconnect line connecting the first driver cell to the sink cells of the row, and a shunt line connecting the second driver cell to a point between ends of the interconnect line.

The IC can further comprise a multilayer metallization on top of a semiconductor wafer. The row of the sink cells, the first and the second driver cell are comprised in the semiconductor wafer. The multilayer metallization comprises at least two metallization layers. The interconnect line being comprised in one of the metallization layers. The shunt line being comprised in another one of the metallization layers being above the one of the metallization layers in the multilayer metallization.

The first and the second driver cells are connected to a common signal line in the IC.

A segment of the interconnect line between the point and the first driver cell can be bigger than 60% of a length the interconnect line and less than 80% of the length of the interconnect line.

The shunt line can be further connected to another point 226 between the ends of the interconnect line. In one embodiment, a segment of the interconnect line between the another point and the first driver cell can be bigger than 40% of the length of the interconnect line and less than or equal to 60% of the length of the interconnect line. In another embodiment, the segment of the interconnect line between the another point and the first driver cell is bigger than 80% of the length of the interconnect line.

The IC can be a semiconductor memory device. The sink cells can be memory cells. The interconnect line can be a word line.

Figure 3:
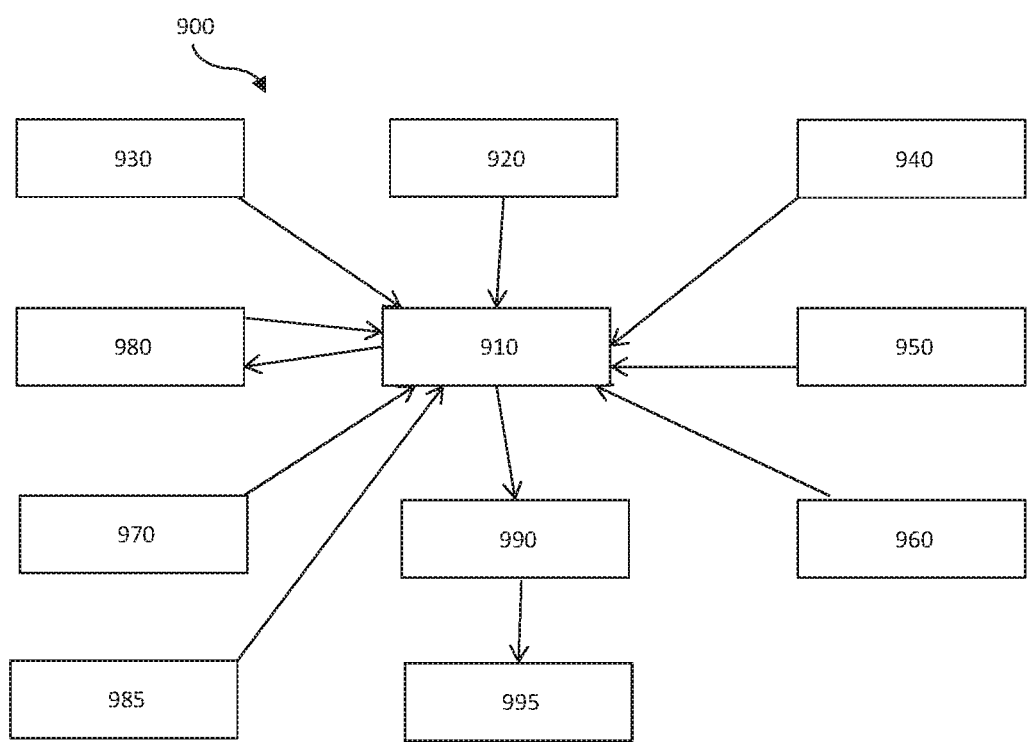
FIG. 3 depicts a flow diagram of a design process used in semiconductor design, manufacture, and/or test.

FIG. 3 is a flow diagram of a design process used in semiconductor design, manufacture, and/or test. The process for generating of layouts of interconnect lines and shunt lines connecting the driver cells to the sink cells in an integrated circuit, which flow diagram is depicted on FIGS. 1a-d, can be a part of the design process depicted on FIG. 3. FIG. 2 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2a-d. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as this shown in FIGS. 2a-d. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIGS. 2a-d to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1a-d and 2a-d. In one embodiment, design structure 990 may comprise a compiled, executable HDL simulation model that functionally simulates the devices shown in FIGS. 2a-d.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1a-d. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for layouting an interconnect line of an integrated circuit, IC, comprising:
   receiving a specification of propagation of an electrical signal in the interconnect line, the interconnect line connecting sink cells of the IC with a first driver cell connected to a source of the electrical signal, the sink cells being layouted in the IC as a row of the sink cells;
   generating a layout of the interconnect line and a shunt line of the interconnect line, the shunt line connecting a second driver cell with the interconnect line at a first point on the interconnect line, the second driver cell being connected to the source of the electrical signal, wherein a length of a segment of the interconnect line between the first driver cell and the first point is equal to a first length being less than a length of the interconnect line;
   generating a layout of the first driver cell having a minimum required driving strength required for propagating the electrical signal in a first segment of the interconnect line between the first driver cell and a second point on the interconnect line having a first propagation property at the second point complying with the specification in assumption that interconnect line is disconnected at the second point, wherein a length of the first segment is a second length being less than the first length; and
   generating a layout of the second driver cell having a minimum required driving strength required for propagating the electrical signal in a second segment of the interconnect line between an open end of the interconnect line and the second point having a second propagation property at the second point complying with the specification and a third propagation property at the open end complying with the specification in assumption that the interconnect line is disconnected at the second point, wherein the first and/or the second and/or the third propagation property comprise at least one of the following: rising slew rate, falling slew rate, and propagation time.

2. The method of claim 1, wherein the first length is bigger than 60% of the length of the interconnect line and less than 80% of the length of the interconnect line, wherein the second length is bigger than 25% of the interconnect line and less than 35% of the length of the interconnect line.

3. The method of claim 1, the method further comprising:
   generating a further layout of the first driver cell having a minimum required driving strength required for propagating the electrical signal in the first segment having another first propagation property at the second point matching the second propagation property in assumption that the interconnect line is disconnected at the second point;
   updating the first length and the second length, wherein in a case when the driving strength of the first driver cell having the previously generated layout exceeds the driving strength of the first driver cell having the newly generated layout by a first predefined value increasing the first length by a first increment value and the second length by a second increment value and in a case when the driving strength of the first driver having the newly generated layout exceeds the driving strength of the first driver cell having the previously generated layout by a second predefined value decreasing the first length by a first decrement value and the second length by a second decrement value, wherein the first decrement value is bigger than the second decrement value, wherein the first increment value is less than the second increment value; and
   after the updating of the first length and the second length updating the layout of the shunt line in a way that it is based on the updated first length and repeating execution of
   the generating of the layout of the first driver cell having a minimum required driving strength required for propagating the electrical signal in the first segment of the interconnect line between the first driver cell and the second point on the interconnect line having a first propagation property at the second point complying with the specification in assumption that interconnect line is disconnected at the second point; and
   the generating of the layout of the second driver cell having a minimum required driving strength required for propagating the electrical signal in the second segment of the interconnect line between the open end of the interconnect line and the second point having a second propagation property at the second point complying with the specification and a third propagation property at the open end complying with the specification in assumption that the interconnect line is disconnected at the second point.

4. The method of claim 3, wherein the first increment value is bigger than zero and less than 10% of the first length, wherein the first decrement value is bigger than zero and less than 10% of the first length, wherein the second increment value is bigger than zero and less than 20% of the second length, wherein the second decrement value is bigger than zero and less than 20% of the second length.

5. The method of claim 3, further comprising:
   in a case when the driving strength of the first driver cell having the previously generated layout does not exceed the driving strength of the first driver having the newly generated layout by the first predefined value and the driving strength of the first driver cell having the newly generated layout does not exceed the driving strength of the first driver having the previously generated layout by the second predefined value executing at least one of the following:
updating the layout of the interconnect line in a way that it is disconnected in the second point; and
updating the layout of the shunt line in a way that it is connected to the interconnect line at a third point, wherein a length of a third segment of the interconnect line between the first driver cell and the third point is bigger than 60% of the length of the interconnect line and less than 80% of the length of the interconnect line.

6. The method of claim 3, wherein the another first propagation property matches the second propagation property when at least one of the following criteria is fulfilled:
a propagation time of the another first propagation property differs from a propagation time of the second propagation property less than a third predefined value;
a rising slew rate of the another first propagation property differs from a rising slew rate of the second propagation property less than a fourth predefined value; and
a falling slew rate of the another first propagation property differs from a falling slew rate of the second propagation property less than a fifth predefined value.

7. The method of claim 1,
wherein the driving strength of the first driver cell is a function of a rising slew rate and/or a falling slew rate of a signal generated by the first driver cell at an input terminal of the sink cell, when only an input terminal of the first driver cell is connected to the source of the electrical signal and only said input terminal of the sink cell is connected to an output terminal of the first driver cell,
wherein the driving strength of the second driver cell is the function of a rising slew rate and/or a falling slew rate of a signal generated by the second driver cell at said input terminal of the sink cell, when only an input terminal of the second driver cell is connected to the source of the electrical signal and only said input terminal of the sink cell is connected to an output terminal of the second driver cell,
wherein the connection of said input terminal of the first driver cell to the source of the electrical signal is the same as the connection of said input terminal of the second driver to the source of the electrical signal and the connection of said output terminal of the first driver cell to said input terminal of the sink cell is the same as the connection of said output terminal of the second driver cell to said input terminal of the sink cell.

8. The method of claim 1, the IC further comprising a multilayer metallization on top of a semiconductor wafer, wherein the row of the sink cells, the first and the second driver cell are comprised in the semiconductor wafer, the multilayer metallization comprising at least two metallization layers, the interconnect line being comprised in one of the metallization layers, the shunt line being comprised in another one of the metallization layers being above the one of the metallization layers in the multilayer metallization.

9. The method of claim 1, wherein the IC is a semiconductor memory device, the sink cells are memory cells, and the interconnect line is a word line.

10. The method of claim 1, the method further comprising:
generating a further layout of the first driver cell having a minimum required driving strength required for propagating the electrical signal in the interconnect line having another first propagation property at the second point complying with the specification and an absolute value of an electrical current flowing through the second point being below a sixth predefined value in assumption that the second driver cell is enabled;
updating the first length and the second length, wherein in a case when the driving strength of the first driver cell having the previously generated layout exceeds the driving strength of the first driver cell having the newly generated layout by a first predefined value increasing the first length by a first increment value and the second length by a second increment value and in a case when the driving strength of the first driver having the newly generated layout exceeds the driving strength of the first driver cell having the previously generated layout by a second predefined value decreasing the first length by a first decrement value and the second length by a second decrement value, wherein the first decrement value is bigger than the second decrement value, wherein the first increment value is less than the second increment value; and
after the updating of the first length and the second length updating the layout of the shunt line in a way that it is based on the updated first length and repeating execution of
the generating of the layout of the first driver cell having a minimum required driving strength required for propagating the electrical signal in the first segment of the interconnect line between the first driver cell and the second point on the interconnect line having a first propagation property at the second point complying with the specification in assumption that interconnect line is disconnected at the second point; and
the generating of the layout of the second driver cell having a minimum required driving strength required for propagating the electrical signal in the second segment of the interconnect line between the open end of the interconnect line and the second point having a second propagation property at the second point complying with the specification and a third propagation property at the open end complying with the specification in assumption that the interconnect line is disconnected at the second point.

11. A computer-implemented method for layouting an interconnect line of an integrated circuit, IC, comprising:
receiving a specification of propagation of an electrical signal in the interconnect line, the interconnect line connecting sink cells of the IC with a first driver cell connected to a source of the electrical signal, the sink cells being layouted in the IC as a row of the sink cells;
generating a layout of the interconnect line and a shunt line of the interconnect line, the shunt line connecting a second driver cell with the interconnect line at a first point on the interconnect line, the second driver cell being connected to the source of the electrical signal, wherein a length of a segment of the interconnect line between the first driver cell and the first point is equal to a first length being less than a length of the interconnect line;
generating a layout of the first driver cell having a minimum required driving strength required for propagating the electrical signal in the interconnect line having a first propagation property at a second point on the interconnect line complying with the specification in assumption that the second driver cell is disabled, wherein a length of a first segment of the interconnect line between the first driver cell and the second point is a second length being less than the first length; and generating a layout of the second driver cell having a minimum required driving strength required for propagating the electrical signal in the interconnect line having a second propagation property at the second point complying with the specification and a third propagation property at the open end complying with the specification in assumption that the first driver cell is disabled, wherein the first and/or the second and/or the third propagation property comprise at least one of the following: rising slew rate, falling slew rate, and propagation time.

12. The method of claim 11, the method further comprising:

generating a further layout of the first driver cell having a minimum required driving strength required for propagating the electrical signal in the interconnect line having another first propagation property at the second point complying with the specification and an absolute value of an electrical current flowing through the second point being below a sixths predefined value in assumption that the second driver cell is enabled;

updating the first length and the second length, wherein in a case when the driving strength of the first driver cell having the previously generated layout exceeds the driving strength of the first driver cell having the newly generated layout by a first predefined value increasing the first length by a first increment value and the second length by a second increment value and in a case when the driving strength of the first driver having the newly generated layout exceeds the driving strength of the first driver cell having the previously generated layout by a second predefined value decreasing the first length by a first decrement value and the second length by a second decrement value, wherein the first decrement value is bigger than the second decrement value, wherein the first increment value is less than the second increment value; and after the updating of the first length and the second length updating the layout of the shunt line in a way that it is based on the updated first length and repeating execution of the generating of the layout of the first driver cell having a minimum required driving strength required for propagating the electrical signal in the interconnect line having a first propagation property at the second point on the interconnect line complying with the specification in assumption that the second driver cell is disabled; and the generating of the layout of the second driver cell having a minimum required driving strength required for propagating the electrical signal in the interconnect line having a second propagation property at the second point complying with the specification and a third propagation property at the open end complying with the specification in assumption that the first driver cell is disabled.

* * * * *